US007176583B2

(12) United States Patent
Daubenspeck et al.

(10) Patent No.: US 7,176,583 B2
(45) Date of Patent: Feb. 13, 2007

(54) DAMASCENE PATTERNING OF BARRIER LAYER METAL FOR C4 SOLDER BUMPS

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 10/710,562

(22) Filed: Jul. 21, 2004

(65) Prior Publication Data

US 2006/0016861 A1 Jan. 26, 2006

(51) Int. Cl.
*H01L 23/52* (2006.01)
*H01L 23/48* (2006.01)
*H01L 23/40* (2006.01)
*H01L 23/485* (2006.01)
*H01L 23/498* (2006.01)

(52) U.S. Cl. ............... 257/781; 257/780; 257/738; 257/E23.021; 257/E23.069

(58) Field of Classification Search ........ 257/737–738, 257/779–781, E23.21, E23.069; 438/612–614
See application file for complete search history.

(56) References Cited

U.S. PATENT DOCUMENTS

| 5,298,459 | A | * | 3/1994 | Arikawa et al. ............. 438/614 |
| 5,376,584 | A | * | 12/1994 | Agarwala ................... 438/614 |
| 6,332,988 | B1 | | 12/2001 | Berger, Jr. et al. |
| 6,415,974 | B2 | | 7/2002 | Jao |
| 6,426,556 | B1 | | 7/2002 | Lin |

* cited by examiner

*Primary Examiner*—Luan Thai
(74) *Attorney, Agent, or Firm*—Scully, Scott, Murphy & Presser, P.C.; William D. Sabo, Esq.

(57) ABSTRACT

A system and method for forming a novel C4 solder bump for BLM (Ball Limiting Metallurgy) includes a novel damascene technique is implemented to eliminate the Cu undercut problem and improve the C4 pitch. In the process, a barrier layer metal stack is deposited above a metal pad layer. A top layer of the barrier layer metals (e.g., Cu) is patterned by CMP. Only bottom layers of the barrier metal stack are patterned by a wet etching. The wet etch time for the Cu-based metals is greatly reduced resulting in a reduced undercut. This allows the pitch of the C4 solder bumps to be reduced. An alternate method includes use of multiple vias at the solder bump terminal.

10 Claims, 6 Drawing Sheets

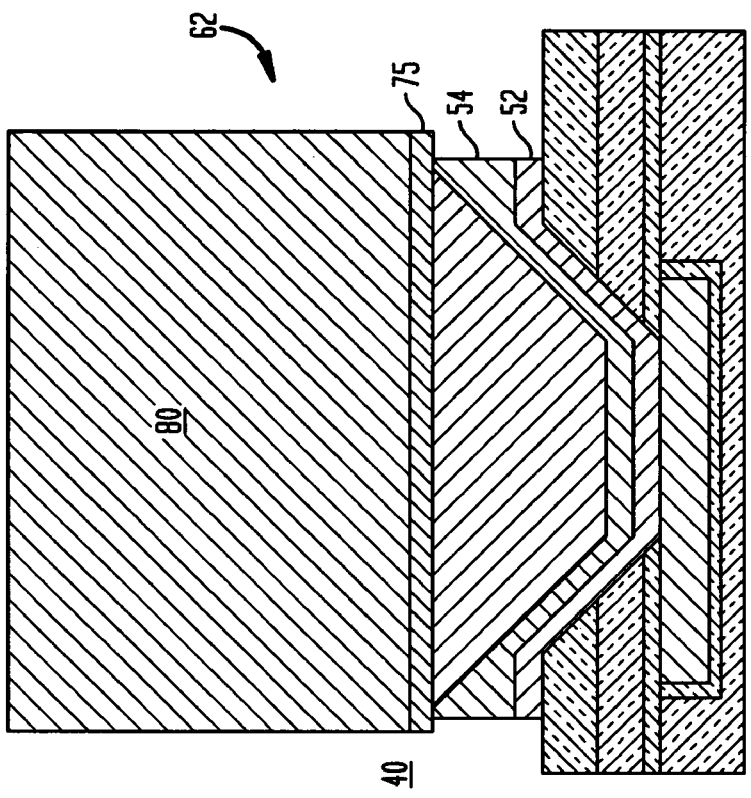
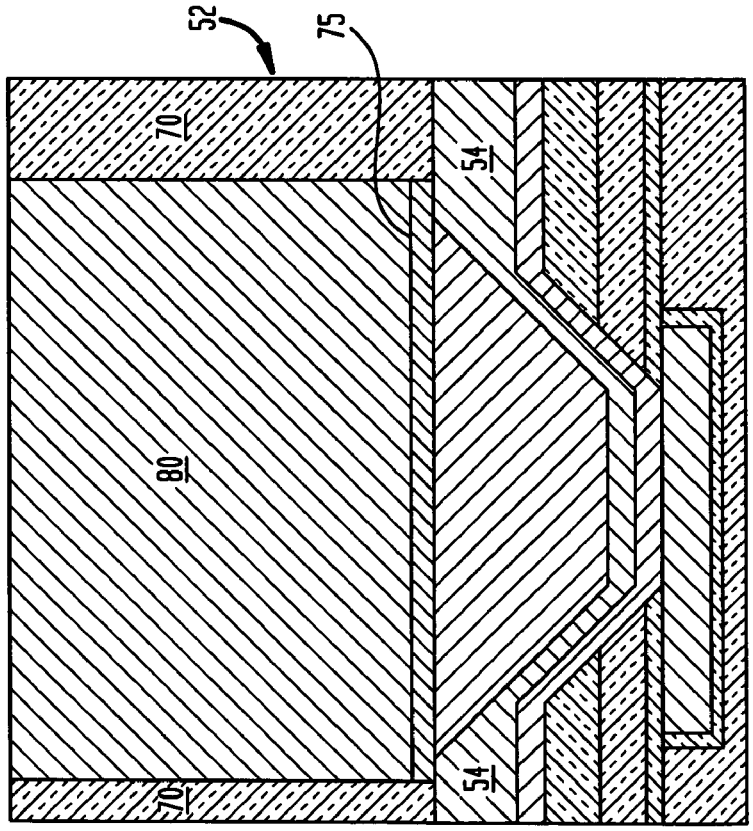

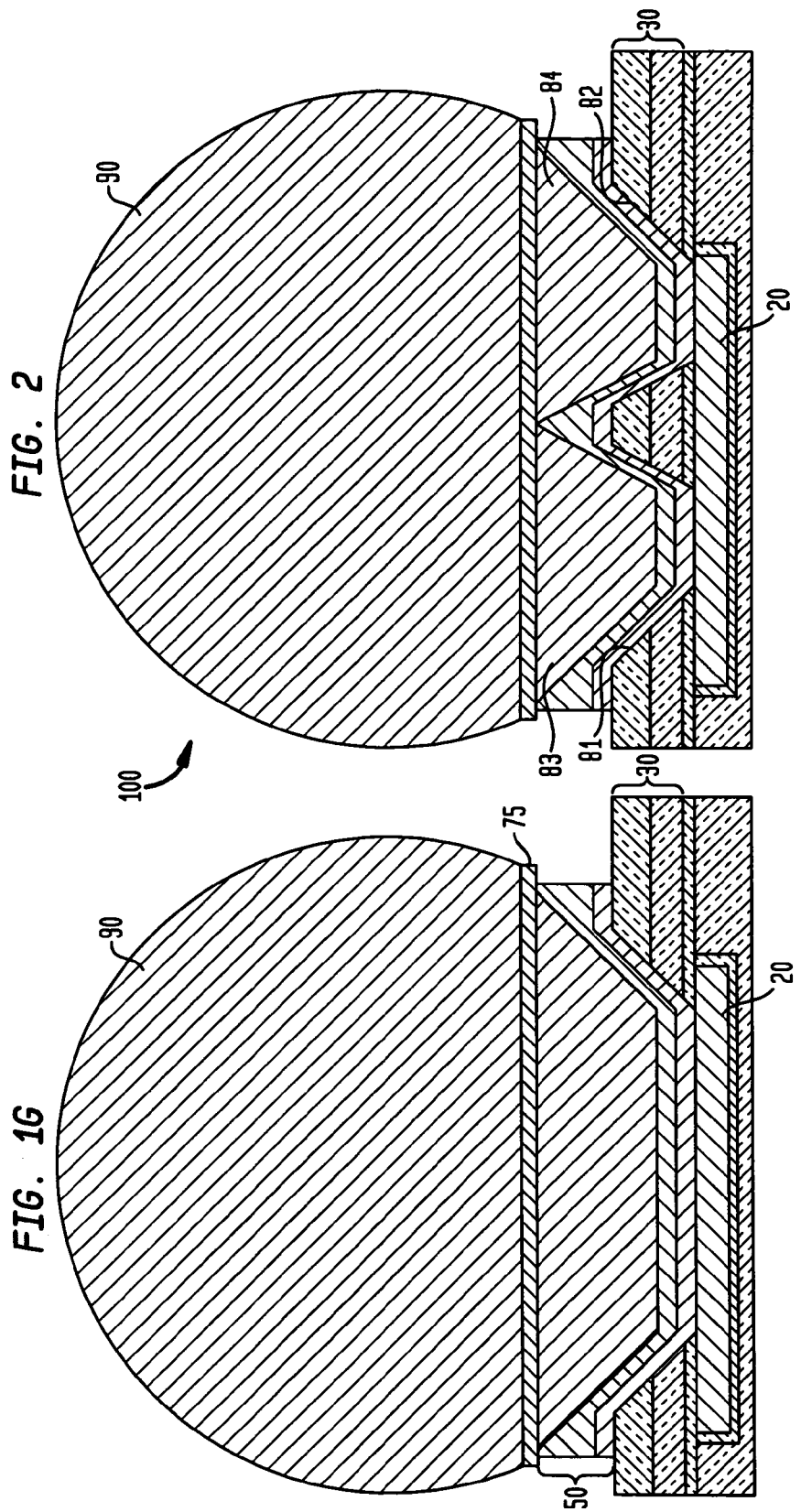

DAMASCENE PATTERNING OF BARRIER LAYER METAL FOR C4 SOLDER BUMPS

BACKGROUND ART

1. Field of the Invention

The present invention relates generally to the fabrication of semiconductor chips, and more particularly to a structure and novel methodology for forming solder bumps in Back-End-Of-Line (BEOL) semiconductor chip processing.

2. Description of the Prior Art

Controlled Collapse Chip Connection (C4) processes are well known in forming solder bumps in back-end-of line semiconductor fabrication, e.g., when chips are connected to their packaging. Typically, the formation of a C4 solder bump includes the conventional formation of a metallurgical system that includes the underlying final metal layer (pad), an Under Bump Metallurgy (UBM) and the solder ball. The UBM ideally should provide good adhesion to a wafer passivation and to the IC final metal pad, and, function as an effective solder diffusion barrier.

Current fabrication techniques implement Pb-free C4's using plating of the solder in a photoresist pattern, followed by wet etching of the UBM. In the prior art solder bump plating process, the UBM includes the deposition of an adhesion layer, e.g., a titanium-tungsten alloy (TiW), followed by wetting layers of Cr—Cu (chromium-copper alloy) and copper (Cu). The wetting layers ensure the solder completely covers the patterned Ti—W adhesion layer (thereby ensuring a large contact area between the solder ball and the chip, and providing high mechanical strength. In the solder bump plating process, the wafer is cleaned to remove oxides or organic residue prior to metal deposition and to roughen the wafer passivation and bond pad surface to promote better adhesion of the UBM. The UBM barrier layer metals such as TiW, Cr—Cu, and Cu may then be sequentially sputtered or evaporated over the entire wafer so that the UBM adheres to the wafer and passivation in addition to the bond pads. Next, a photoresist layer is applied and then metal layers (e.g., a Ni barrier layer followed by a Sn-based solder) are plated over the bond pad to a height as determined by the patterned photoresist. After the solder bump is formed, the photoresist is stripped, leaving the UBM exposed on the wafer. The UBM is subsequently removed from the wafer using a wet etch process (e.g., an $H_2O_2$-based wet etch).

As integrated circuits shrink in size, the pitch of the C4 solder bumps must also shrink. In the conventional C4 processing described, the barrier layer metals (typically TiW/CrCu/Cu) are wet etched after plating of the solder. Unfortunately, as C4 pitch decreases, the wet etch causes increasingly more undercut of the C4 solder bump (i.e., a greater percentage of area underneath the C4 is undercut), which degrades the mechanical reliability of the C4.

It would be highly desirable to provide a C4 fabrication technique that results in an improved C4 pitch and increases the mechanical stability of the formed solder bump.

SUMMARY OF THE INVENTION

It is thus an object of the present invention to provide an improved method of forming a solder bump connection at a metallic bonding pad surface of a semiconductor chip. In accordance with this object, a novel damascene technique for patterning of the UBM layers is implemented to eliminate a copper (Cu) undercut problem and improve the C4 pitch.

According to a first embodiment, the method includes steps of forming a patterned passivation layer upon a metal bonding pad surface, the patterned passivation layer including an opening at the metallic bonding pad surface to define a location for the solder bump connection. Then a barrier material stack including top and bottom conductive material layers is formed upon the patterned passivation layer and conforming to a surface of the patterned passivation layer. A next step includes removing the top conductive material layer portion of the barrier material stack adjacent the solder bump connection location so that a top conductive material layer portion at the solder bump connection location provides a surface that is substantially coplanar with a surface of a remaining bottom conductive material layer adjacent the solder bump connection location. Then a patterned resist material layer is formed upon the substantially coplanar surface that includes an opening at the defined solder bump connection location. A diffusion barrier layer is then formed upon the substantially coplanar surface defined by said patterned resist material layer opening and a solder material is provided upon a surface of the diffusion barrier layer between patterned walls defining the patterned resist material layer opening. Finally, the patterned resist material layer is removed and the remaining bottom conductive material layer portions of the barrier material stack under the patterned resist layer are removed. The solder material may then be reflowed to form the solder bump connection.

Advantageously, the bottom conductive material layer adjacent the solder bump connection exhibits decreased amount of undercut under the diffusion barrier layer to enable reduced pitch and increased mechanical stability of the formed solder bump connection. This is because the step of removing the remaining bottom conductive material layer portions of the barrier material stack includes implementing a wet etch, wherein a total etch time for removing the remaining bottom conductive material layer portions is reduced due to prior removal of the top conductive material layer portion adjacent the solder bump connection location. Thus, for example, a top layer of the barrier material layer stack (e.g., Cu) is patterned by CMP. Only bottom two layers (e.g., Cr—Cu, Ti—W) are patterned by wet etching (or dry etching in the case of TiW). The wet etch time for the Cu-based metals is greatly reduced (by about 66%, because Cu is two (2) times the thickness of the Cr—Cu in the bottom layers), so the undercut is also reduced. This allows the pitch of the C4 solder bumps to be reduced. In a further embodiment, the formed patterned passivation layer may include two or more via openings at the metallic bonding pad surface that defines a location for the solder bump connection. This facilitates the CMP process, by reducing dishing of the top conductive material layer during a CMP step that removes the top conductive material layer of the barrier layer stack.

Alternately, or in addition, the formed patterned passivation layer upon may include a first via opening at the metallic bonding pad surface to define a location for said solder bump connection, and include a second via opening adjacent the solder bump connection location to define a dummy via location. As the method of forming a solder bump connection includes implementing an electroplating technique for depositing the solder material, the remaining top conductive material layer portion at the dummy via location enabling a plating of solder with increased uniformity. Using this option, it is possible to remove a greater amount of the wetting layers (Cr—Cu) by CMP, thereby allowing a further reduction in the UBM removal wet etch time.

BRIEF DESCRIPTION OF THE DRAWINGS

Further features, aspects and advantages of the structures and methods of the present invention will become better understood with regard to the following description, appended claims, and accompanying drawings where

FIG. 1(e) illustrates the resulting structure after diffusion barrier deposition and solder deposition;

FIG. 1(f) illustrates the resulting structure after wet etch of the lower barrier metal layers (e.g., Cr—Cu and Ti—W layers) of the stack and the resist removal;

FIG. 1(g) illustrates the resulting structure after the reflow solder step;

FIG. 2 illustrates the resulting structure according to a second embodiment of the invention whereby two or more small vias are provided at the solder bump location to prevent Cu dishing during a Cu polish step; and, FIGS. 3(a)–3(c) illustrate additional steps for forming a solder joint according to another embodiment of the invention that includes forming a dummy via bar adjacent the Cu barrier layer.

DETAILED DESCRIPTION OF THE PREFERRED EMBODIMENTS

Figure 1A:
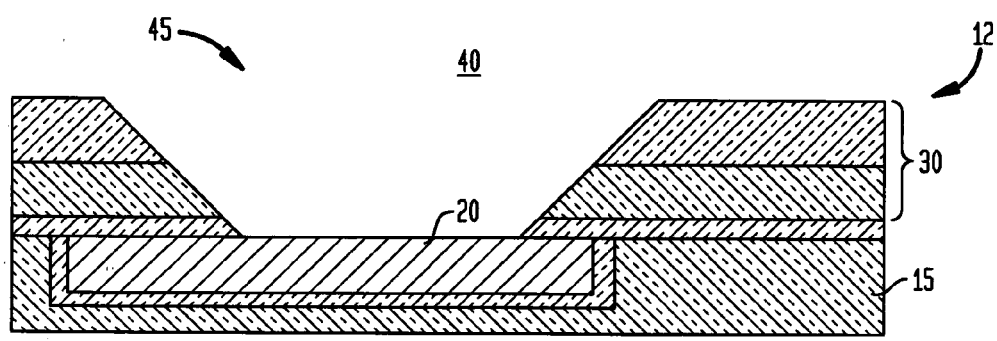
FIG. 1(a) illustrates a last Cu wire level and patterned passivation layer according to the first embodiment of the invention.
Figure 1B:
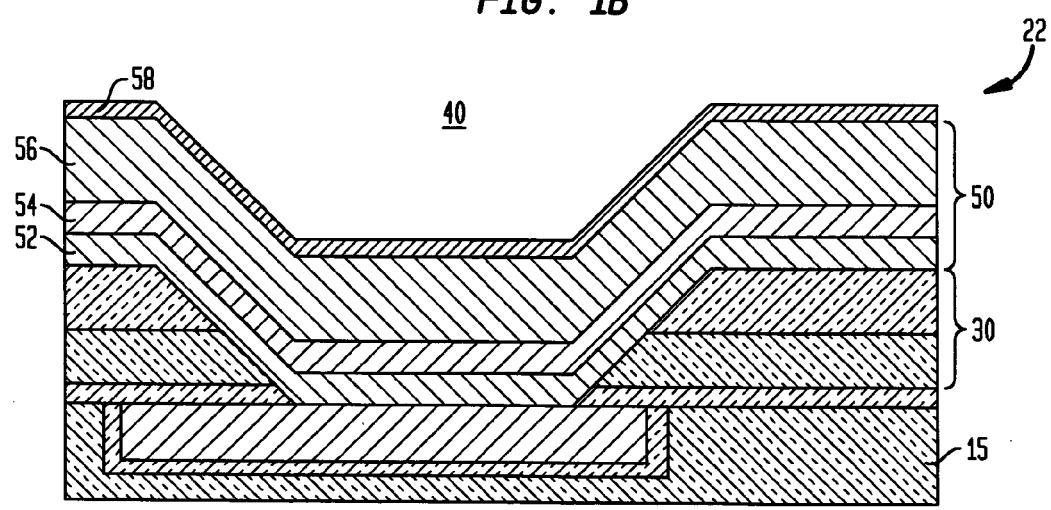
FIG. 1(b) depicts a deposition of barrier layer metal stack upon structure of FIG. 1(a) including an optional polish stop layer.

The process flow for forming a novel solder bump metallurgy according to the invention is now described with reference to FIGS. 1(a)–1(g). As shown in FIG. 1(a), a first process step 12 is depicted that includes the step of forming a passivation layer 30 upon the chip surface that includes a last conducting metal layer 20, e.g., a metallic bonding pad layer comprising Cu, Al, or other conducting metal layer, in a low-k interconnect dielectric material layer 15 such as an oxide such as FSG (i.e., fluoro-silicate glass or like fluorinated silicon oxide,) an organic dielectric, such as SiLK, or a hybrid dielectric, such as SiCOH. The passivation layer 30 is deposited using conventional deposition techniques, such as plasma-enhanced chemical vapor deposition (PECVD) and may comprise one or more passivation material layers, such as SiO2 and SiN. In one embodiment depicted in FIG. 1(a), the passivation layer 30 comprises a stack of deposited passivation material layers including a lower layer such as SiN, an intermediate layer such as $SiO_2$ and an upper passivation layer including SiN formed using conventional processing. It is understood that the passivation material layer stack 30 is patterned to outline a location for the solder bump terminal 40. For example, as shown in FIG. 1(a), a single via opening 45 is etched at a location above the surface of the metallic pad layer 20 to define the location for the solder bump terminal 40. Next, as shown in FIG. 1(b), a further process step 22 includes depositing underbump metallurgy UBM which, according to the embodiments described herein, comprise a stack of barrier layer metals 50 that conform to the shape of the underlying passivation layer 30. In one embodiment depicted in FIG. 1(b), the barrier layer metals 50 comprises a stack of deposited material layers including a bottom layer of Ti—W (Titanium-Tungsten diffusion barrier 52), an intermediate layer of Cr—Cu (chromium copper wetting layer 54) and, a top layer of Cu 56 all deposited utilizing physical vapor deposition techniques (PVD). It is understood however, that the barrier metal layer may comprise other materials in a variety of stack configurations. Other metal layers that can be used for the under bump metallurgy include Ta, TaN, W, Ti, Al, Ni, Ni alloys, and Au. Some other UBM stacks (in addition to TiW/CrCu/Cu) include TiW/Cu, Ti/Cu, Ti/Ni—V/Cu, Al/Ni—V/Cu. It is further understood that other deposition techniques may be utilized to form the barrier metal layer stack including CVD, electroless plating, and electroplating.

In one embodiment depicted in FIG. 1(b), the first layer of Ti—W 52 may be deposited to a thickness ranging between about 50 nm to 300 nm, with a typical thickness of about 150 nm, for instance; the CrCu layer 54 may be deposited to a thickness ranging between about 50 nm to 500 nm, with a typical thickness of about 200 nm, for instance; and, the Cu layer 56 may be deposited to a thickness ranging between about 100 nm to 1000 nm, with a typical thickness of about 400 nm, for instance. An optional sacrificial Ta layer 58, deposited to a thickness ranging between about 10 nm to 200 nm, with a preferred thickness of about 50 nm, can be further deposited on top of the barrier layer metal stack 50 to function as a polish stop thereby preventing dishing of Cu during a subsequent CMP step.

Figure 1C:
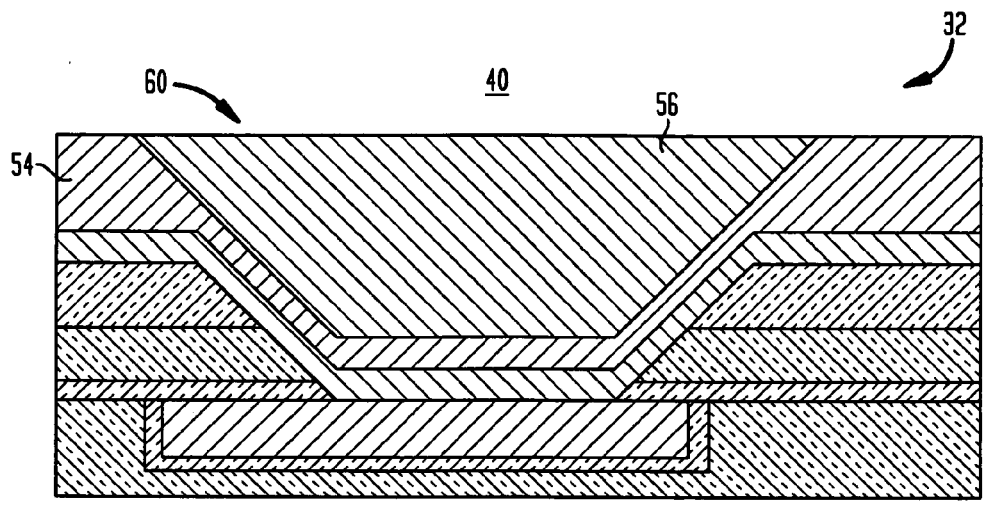
FIG. 1(c) illustrates the resulting structure after the top upper conductive material layer polish step.
Figure 1D:
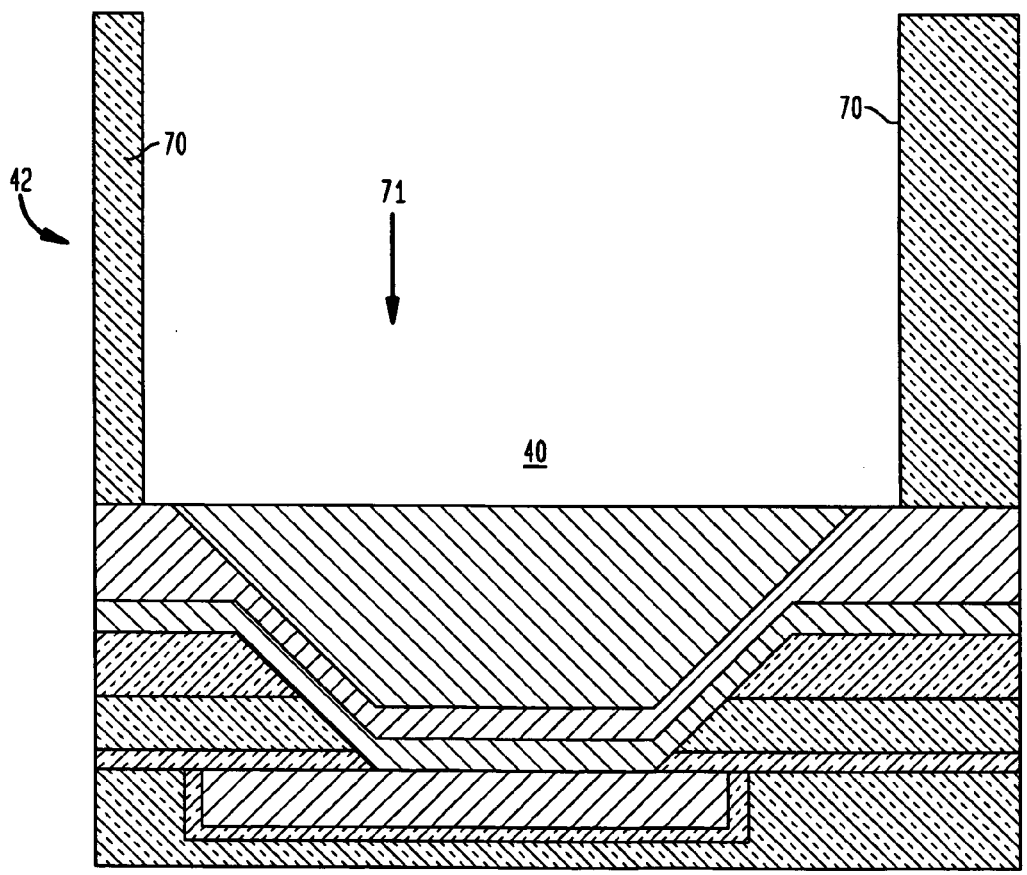
FIG. 1(d) illustrates the step of forming a resist pattern for the C4 solder bumps.

In the next process step 32, shown in FIG. 1(c), the top Cu barrier metal layer 56 is polished (and the optional Ta layer 58 is polished) stopping on the intermediate CrCu layer 54 to leave the structure where the top metal layer (e.g., Cu) of the barrier stack is substantially coplanar with the intermediate layer 54 (e.g., CrCu) and forms a substantially flat horizontal surface. This is accomplished utilizing well known CMP (chemical mechanical polishing) steps. Then, in a next process step 42 as shown in FIG. 1(d), using conventional processing, a resist material layer 70 is patterned to include an opening 71 that defines the subsequent formation of the solder bump at solder bump terminal 40.

The next process step 52 depicted in FIG. 1(e) includes the deposition of a diffusion barrier layer 75 over the coplanar surface defined at the opening between walls of the patterned resist 70. In the embodiments described, diffusion barrier layer may include a nickel (Ni) material or alloy, such as Ni—V or Ni—P, that is deposited over the flat coplanar surface 60 at the solder bump terminal 40. Further depicted in FIG. 1(e) is the formation of solder bump material 80 within the walls of the patterned resist layer 70 at the solder bump terminal. Preferably, the solder material 80 is deposited using a well-known electroplating technique. In one embodiment depicted in FIG. 1(e), the Ni diffusion layer 75 may be deposited to a thickness ranging from about 500 nm to 5000 nm, for instance, with a typical thickness of about 1000 nm.

Next, as shown as process step 62 depicted in FIG. 1(f), the patterned resist material layer 70 is removed, e.g., stripped, and a wet etch process is implemented to remove the CrCu 54 and TiW 53 barrier metal layers adjacent, the terminal 40. Finally, the solder is reflowed to form a sphere or solder ball 90 such as shown in FIG. 1(g).

The methodology described herein with respect to FIGS. 1(a)–1(g) enables the pitch of the C4 solder bumps to be reduced. That is, the polishing of the Cu layer 56 as shown in FIG. 1(c) effectively removes the Cu material underneath the patterned resist 70 and thus, reduces the total etch time for the underlying Cr—Cu and Ti—W barrier metal layers. For example, when only the bottom two layers (e.g., Cr—Cu layer 54, and Ti—W layer 52) are patterned by wet etching as shown in FIG. 1(f), the wet etch time for the Cu-based metals is greatly reduced (e.g., by about 66%, because Cu is about two (2) times the thickness of the Cr—Cu in the bottom layers. This reduction of the total etch time enables a reduced undercut of the barrier material layers formed under the solder bump (i.e., under the Ni barrier layer 75) during the wet etch process, and consequently increases the mechanical stability of the formed solder bump.

In a second embodiment of the invention depicted in FIG. 2, a series of multiple small vias 81, 82 are fabricated over the last metal pad layer at the solder bump terminal 40 rather than the single large via depicted in FIGS. 1(a)–1(g). In the example shown in FIG. 2, two small via openings 81, 82 are manufactured using conventional via opening formation techniques instead of the one larger via opening depicted in FIG. 1(a). The advantage to this is that there is less dishing of the Cu during the CMP step depicted in FIG. 1(c). Thus, in this second embodiment, as shown in the example depicted in FIG. 2, two smaller via openings are formed above the last metal pad layer surface. All other fabrication steps for the C4 solder connection terminal according to the second embodiment of the invention are the same as in the first embodiment depicted in FIGS. 1(a)–1(g), however, the upper Cu barrier metal layer 56 of the barrier material stack between each of said two via openings and adjacent the solder bump connection location are removed, stopping on the adjacent CrCu layer 54, so that respective remaining upper conductive material layer portions 83, 84 at the via openings 81, 82 of said solder bump terminal defines a surface that is substantially coplanar with a surface of said remaining lower conductive material layers 54 of the barrier material stack adjacent the solder bump terminal location. This is accomplished utilizing well known CMP (chemical mechanical polishing) steps. Then, using conventional processing, a resist material layer is patterned to outline the subsequent formation of the solder bump at the solder bump terminal 40, in the manner as described herein with respect to FIGS. 1(d)–1(g), to result in the structure 100 as shown in FIG. 2.

Figure 3A:
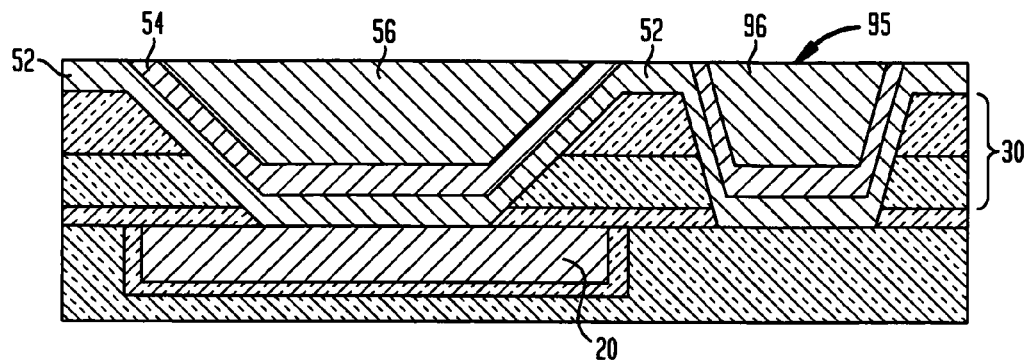
Figure 3B:
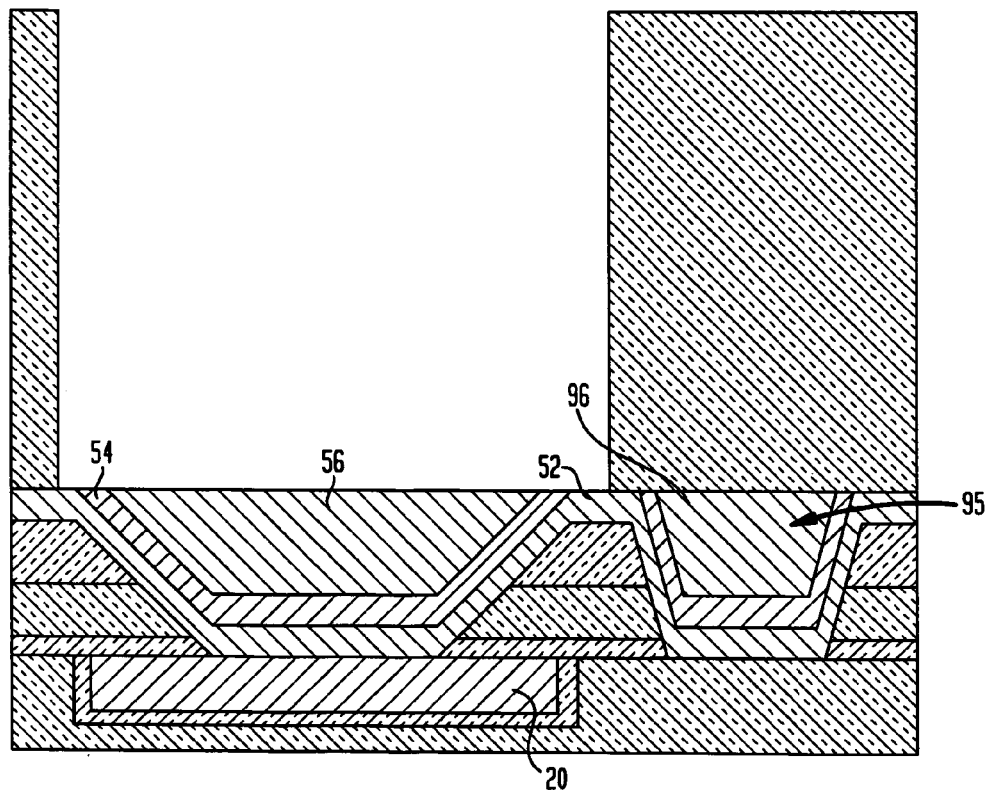
Figure 3C:
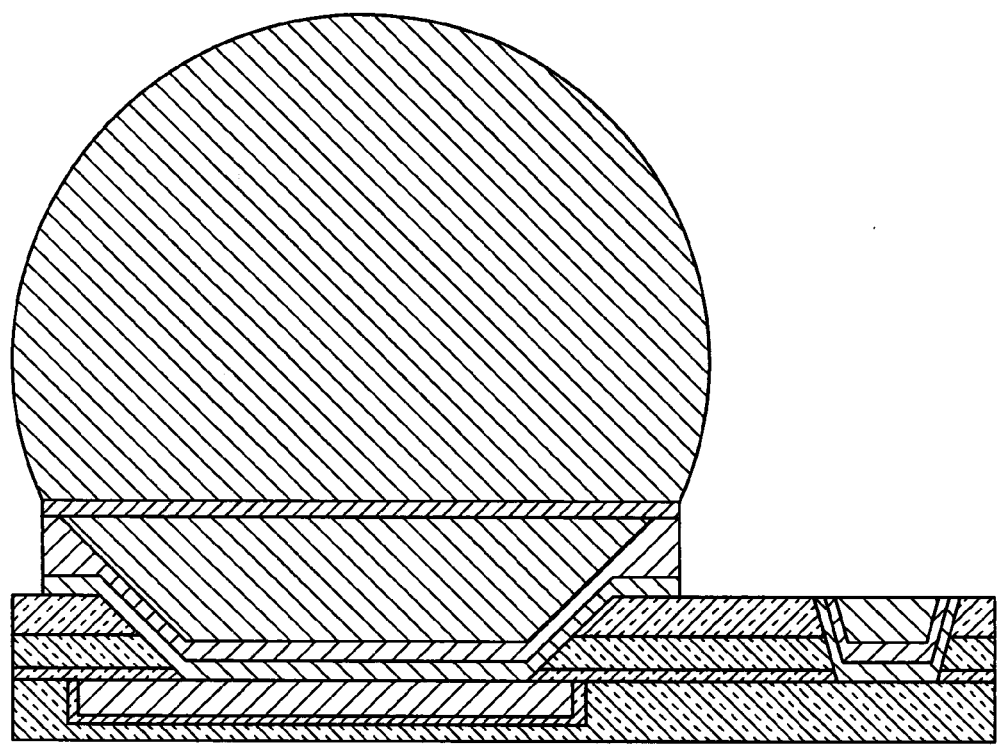

In a third embodiment of the invention depicted in FIGS. 3(a)–3(c), rather than removing only the top barrier metal layer 56 (e.g., Cu) by CMP (and the optional Ta layer) as in the prior embodiments, both the Cu 56 and intermediate CrCu layers 54 are polished to leave the structure 200 shown in FIG. 3(a). This further reduces the wet etch time and undercut, allowing further reduction in solder ball pitch. It is noted that the undercut can be completely eliminated if the Ti—W is patterned by a reactive ion etch (RIE) process. However, a disadvantage is that the solder ball electroplating process will be more difficult, due to the relatively high resistance of the remaining Ti—W barrier stack layer 52, which serves as an electrode during electroplating. To counter the phenomena of increased resistance as shown in FIG. 3(a)–3(c), solder bump plating is optimized to achieve uniform plating by fabricating a dummy via bar 95, adjacent the solder bump terminal, that provide low resistance Cu 96 in between solder bumps to allow uniform plating.

Thus, in a third embodiment of the invention depicted in FIGS. 3(a)–3(c), the processing is the same as in the prior two embodiments of the method for forming a solder bump connection at a metallic bonding pad surface of a semiconductor chip. However, the formed patterned passivation layer upon the metal bonding pad surface includes a first via opening at the metallic bonding pad surface to define a location for the solder bump connection, and the second via bar opening adjacent the solder bump connection location to define a dummy via bar location. After forming the barrier material layer stack 50 including top and bottom conductive material layers, the top conductive material layer portions of the barrier material stack adjacent the solder bump connection location and adjacent the dummy via location are removed (e.g., by CMP) so that a remaining top conductive material layer portion at the solder bump connection location and at the dummy via bar location defines a surface that is substantially coplanar with a surface of remaining underlying conductive material layer 52, 54 adjacent the solder bump connection and dummy via bar locations. The remaining method steps depicted in FIGS. 3(a) and 3(b) of forming the solder bump connection according to the third embodiment are the same as described herein with respect to FIGS. 1(c)–1(d), with the advantage that the added conductive material layer portion at the dummy via 95 enables a more uniform plating of the solder bump. That is, dummy via bars provide a low resistance seed layer for the solder material electroplating step. The resultant structure for the solder bump terminal 200 according to the third embodiment of the invention is shown in FIG. 3(c).

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

The invention claimed is:

1. A solder bump connection at a surface of a metallic bonding pad of a semiconductor chip comprising:
   a patterned passivation layer formed upon said metal bonding pad surface, said patterned passivation layer including an opening at said metal bonding pad surface defining a location for said solder bump connection;
   a barrier material stack formed above said patterned passivation layer and including top and bottom conductive material layers, portions of said top conductive material layer portion adjacent said solder bump connection being removed such that a top conductive material layer at said solder bump connection location includes a surface that is substantially coplanar with a surface of remaining bottom conductive material layer portions adjacent said solder bump connection location;
   a diffusion barrier layer formed upon said substantially coplanar surface at said solder bump connection location; and,
   a solder bump formed upon a surface of said diffusion barrier layer, wherein portions of said bottom conductive material layer adjacent said solder bump connection exhibit decreased amount of undercut under said diffusion barrier layer to enable reduced pitch and increased mechanical stability of said solder bump connection.

2. The solder bump connection as claimed in claim 1, wherein said patterned passivation layer comprises one or more passivation material layers.

3. The solder bump connection as claimed in claim 1, wherein said metallic bonding pad comprises material including one of Cu or Al.

4. The solder bump connection as claimed in claim 1, wherein said metal bonding pad is formed in a low-k interconnect dielectric material layer.

5. The solder bump connection as claimed in claim 1, wherein said top conductive material layer includes Cu and a lower barrier material layer comprises material including Ti—W.

6. The solder bump connection as claimed in claim 1, wherein said barrier material layer stack further includes an intermediate conductive material layer between said top and bottom conductive material layers, said top conductive material layer being substantially coplanar with said intermediate conductive material layer adjacent said solder connection location.

7. The solder bump connection as claimed in claim 6, wherein said intermediate conductive material layer comprises CrCu.

8. The solder bump connection as claimed in claim 1, wherein said formed patterned passivation layer includes a single via opening at said metallic bonding pad surface.

9. The solder bump connection as claimed in claim 8, wherein said formed patterned passivation layer further includes a via bar opening adjacent said single via opening at said metal bonding pad surface.

10. The solder bump connection as claimed in claim 1, wherein said formed patterned passivation layer includes multiple via openings at said metal bonding pad surface.

* * * * *